United States Patent [19]
Bae

[11] Patent Number: 6,072,883
[45] Date of Patent: Jun. 6, 2000

[54] CIRCUIT FOR AUTOMATICALLY ADJUSTING INPUT SENSITIVITY OF AUDIO SIGNAL IN MONITOR

[76] Inventor: Chul Soo Bae, 153 Suljung-Ri, Changnyoung-Eup, Changnyoung-Gun, Kyoungsangnam-Do, Rep. of Korea

[21] Appl. No.: 08/982,015

[22] Filed: Dec. 1, 1997

[30] Foreign Application Priority Data

Dec. 4, 1996 [KR] Rep. of Korea ................... P96-61718

[51] Int. Cl.[7] .................................................. H03G 3/00
[52] U.S. Cl. .............................. 381/107; 381/56; 381/58
[58] Field of Search .................................... 381/104, 107, 381/55, 56, 58

[56] References Cited

U.S. PATENT DOCUMENTS 4,276,604  6/1981  Kitamura et al. .

Primary Examiner—Ping Lee
Attorney, Agent, or Firm—Oppenheimer Wolff & Donnelly LLP

[57] ABSTRACT

An audio input sensitivity adjusting circuit for a monitor which can properly adjust the audio input level even though an overinput signal is inputted from a sound card or a loudspeaker of a personal computer. The circuit includes an input sensitivity adjusting section for adjusting an input sensitivity of the audio signal by a predetermined level, a converter for converting the audio signal into a DC signal, an integrator circuit for integrating the DC signal outputted from the converter, a level adjusting section for comparing the DC signal integrated by the integrator circuit with a predetermined reference signal and outputting an input switching control signal as a result of comparison, a lock up circuit for maintaining the input switching control signal outputted from the level adjusting section in its outputted state, and a switching section for switching the audio signal inputted from the input sensitivity adjusting section to the pre-amplifier in accordance with the input switching control signal maintained by the lock up circuit.

2 Claims, 2 Drawing Sheets

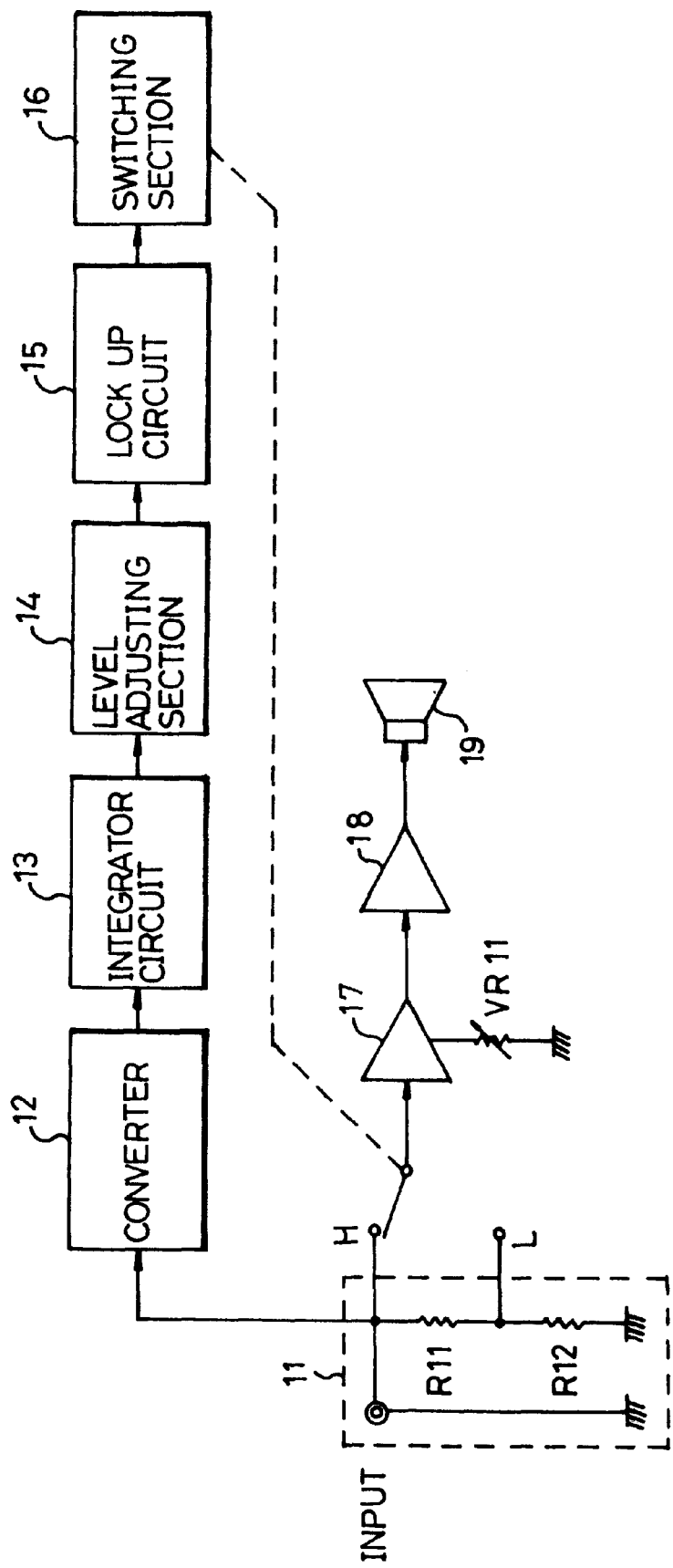

CIRCUIT FOR AUTOMATICALLY ADJUSTING INPUT SENSITIVITY OF AUDIO SIGNAL IN MONITOR

BACKGROUND OF THE INVENTION

1. Field of the Invention

The present invention relates to a circuit for automatically adjusting the input sensitivity of an audio signal in a monitor. In particular, the present invention relates to a circuit for automatically adjusting the input sensitivity of an audio signal in a monitor capable of preventing the audio signal processing circuit of the monitor from being damaged, by setting a proper reference value for the audio input sensitivity and by applying the input audio signal with a proper level in accordance with the size of the audio input of the personal computer, even if an overinput of an audio signal is inputted thereto due to the output of the sound card or the loudspeaker of the personal computer.

2. Description of the Related Art

The audio signal processing circuit of the monitor is generally classified into a circuit having a two-system input terminals consisting of an input from a loudspeaker and a line input terminal, and a circuit having a line input terminal only.

Referring to FIG. 1, the conventional audio signal processing circuit of the monitor having the loudspeaker input terminal and the line input terminal, comprises an input sensitivity adjusting section 1 for adjusting the input sensitivity of the audio signal applied to the loudspeaker input terminal and the line input terminal to which the audio signal via the sound card of the personal computer is inputted, a pre-amplifier 2 for pre-amplifying the audio signal controlled by the input sensitivity adjusting section 1, a power amplifier 3 for amplifying the audio signal outputted from the pre-amplifier 2, and a loudspeaker 4 for outputting the audio signal amplified through the pre-amplifier 3. Reference numerals R1 and R2 indicates resistors, respectively, and VR1 indicates a variable resistor for adjusting volume.

According to the conventional audio signal processing circuit of the monitor as described above, when the audio signal is applied to the line input terminal or the loudspeaker input terminal through the sound card of the personal computer, the applied audio signal is inputted to the input sensitivity adjusting section 1, as shown in FIG. 1. The audio signal inputted into the input sensitivity adjusting section 1 is attenuated by a predetermined level by the resistors R1 and R2, and then inputted to the pre-amplifier 2. The audio signal inputted to the pre-amplifier 2 is pre-amplified and inputted to the power amplifier 3. The amplified audio signal is inputted to power-amplified and by the power amplifier 3, and outputted to the loudspeaker 4, so that the loudspeaker 4 radiates outwardly the audio signal inputted.

Since the audio signal processing circuit of the monitor is so constructed that the attenuation rate between the loudspeaker input and the line input is in the range of about 5:1 to 10:1, a user can select and connect the input terminal mating with the output condition of the sound card of the personal computer.

Meanwhile, the conventional audio signal precessing circuit of the monitor having the line input system comprises, as shown in FIG. 2, an input sensitivity adjusting section 5 for adjusting the input sensitivity of the audio signal applied to the line input terminal, to which the audio signal via the sound card of the personal computer is applied, a pre-amplifier 6 for pre-amplifying the audio signal adjusted by the input sensitivity adjusting section 5, a power amplifier 7 for amplifying the audio signal outputted from the pre-amplifier 6, and a loudspeaker 8 for outputting the audio signal amplified by the power amplifier 7. Reference numerals R3 and R4 indicate resistors, respectively, and VR2 indicates a variable resistor for adjusting volume.

According to the conventional audio signal processing circuit of the monitor as described above, when the audio signal is applied to the line input terminal from the sound card of the personal computer, the applied audio signal is inputted into the input sensitivity adjusting section 5, as shown in FIG. 2. The audio signal inputted to the input sensitivity adjusting section 5 is attenuated by the predetermined level by the resistors R3 and R4, and then inputted to the pre-amplifier 6. The audio signal inputted to the pre-amplifier 6 is pre-amplified to be inputted to the power amplifier 7. The amplified audio output signal is power-amplified and the power-amplified audio signal is inputted to the loudspeaker 8. The loudspeaker 8 radiates outwardly the audio signal.

Since the audio signal inputted to the input sensitivity adjusting section 5 is adjusted within the range of 0.5 to 0.7 Vrms by the attenuating function of the resistors R3 and R4, the user has to connect line output terminal to maintain a proper input sensitivity.

Because the conventional audio signal processing circuit of the monitor having only one-system line input terminal is not compatible with the sound card of the personal computer having only a speaker output terminal, which is widely used, the output voltage from the speaker terminal becomes about 2 Vrms that is 3 or 4 times higher than the rated input voltage. Thus, the pre-amplifier is overloaded and the distortion is increased, causing the loudspeaker or headphone to be damaged. Also, even in the case of having the two-system input terminal, i.e., the speaker input terminal and the line input terminal, since the input terminal should be properly selected to mate with the output condition of the sound card of the personal computer, it is very inconvenient in use.

SUMMARY OF THE INVENTION

It is an object of the present invention to provide a circuit for automatically adjusting the input sensitivity of an audio signal in a monitor capable of preventing the audio signal processing circuit of the monitor from being damaged, by setting a proper reference value for the audio input sensitivity and by applying the input audio signal with a proper level in accordance with the size of the audio input of the personal computer, even if an overloaded an audio signal is inputted thereto due to the output of the sound card or the loudspeaker of the personal computer.

In order to achieve the above object, the first invention provides an audio input sensitivity adjusting circuit for a monitor having a pre-amplifier and a power amplifier for amplifying an audio signal, the circuit comprising: an input sensitivity adjusting section for adjusting an input sensitivity of the audio signal within a predetermined level; a converter for converting the audio signal attenuated by the input sensitivity adjusting section into a DC signal; an integrator circuit for integrating the DC signal outputted from the converter; a level adjusting section for comparing the DC signal integrated by the integrator circuit with a predetermined reference signal and outputting an input switching control signal as a result of comparison; a lock up circuit for maintaining the input switching control signal outputted from the level adjusting section in its outputted state; and a switching section for switching the audio signal inputted from the input sensitivity adjusting section to the lock up circuit in accordance with the input switching control signal maintained by the lock up circuit.

BRIEF DESCRIPTION OF THE DRAWINGS

The above object, other aspects, and advantages of the invention will become apparent by describing the preferred embodiments thereof with reference to the accompanying drawings, in which:

FIG. 3 is a block diagram of the audio signal processing circuit of a monitor according to the present invention.

DETAILED DESCRIPTION OF THE PREFERRED EMBODIMENTS

Figure 1:
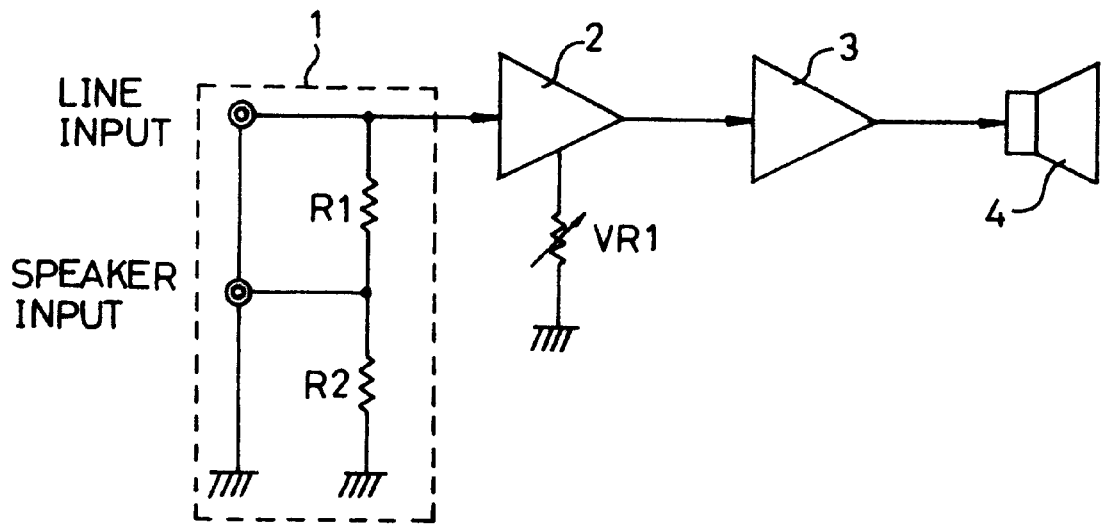
FIG. 1 is a block diagram of a conventional audio signal processing circuit of a monitor having a two system input circuit.
Figure 2:
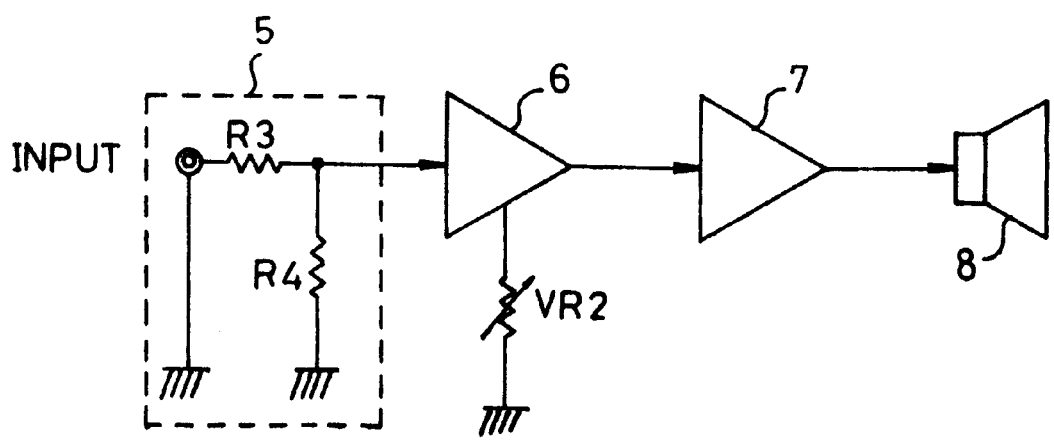
FIG. 2 is a block diagram of a conventional audio signal processing circuit of a monitor having a one-system input circuit.

Referring now to FIG. 3, the audio signal processing circuit of the monitor according to the present invention comprises an input sensitivity adjusting section 11 for adjusting an input sensitivity of the audio signal within a predetermined level, a converter 12 for converting the audio signal into a DC signal, an integrator circuit 13 for integrating the DC signal outputted from the converter 12, a level adjusting section 14 for comparing the DC signal integrated by the integrator circuit 13 with a predetermined reference signal and outputting an input switching control signal as a result of comparison, a lock up circuit 15 such as a bi-stable circuit for maintaining the input switching control signal outputted from the level adjusting section 14 in its outputted state, a switching section 16 for switching the audio signal inputted from the input sensitivity adjusting section 11 to the lock up circuit 15 in accordance with the input switching control signal maintained by the lock up circuit 15, and a power amplifier 18 for amplifying the audio signal outputted from the pre-amplifier 17.

In the input sensitivity adjusting section 11, one terminal of a resistor R11 is connected in common to the input terminal connected to the output terminal of the sound card of the personal computer, and the input terminal of the converter 12, and the other end of the resistor R11 is connected to a resistor R12. The common contact point is also connected to a 'high' level terminal H, and a 'low' level terminal L is connected between the resistors R11 and R12. Also, the output terminal of the power amplifier 18 is connected to the loudspeaker 19 for radiating the audio signal outwardly. The switching contact of the switching section 16 is connected to the 'high' level terminal at an initial stage of the system.

Reference numeral VR11 indicates a variable resistor for adjusting the amplification factor of the pre-amplifier 17.

The operation of the audio signal precessing circuit according to the present invention as constructed above will now be explained in detail.

First, when output signal of the sound card is inputted to the input sensitivity adjusting section 11 regardless of the kind of the sound card of the personal computer, the audio signal is inputted to the input terminal of the input sensitivity adjusting section 11 from the sound card of the personal computer. This audio signal is attenuated by a predetermined level by the resistors R11 and R12 in the input sensitivity adjusting section 11, and then outputted through the 'high' level terminal H or 'low' level terminal L. At that time, the audio signal of the input sensitivity adjusting section 11 is also inputted to the converter 12. The converter 12 converts the audio signal from the input sensitivity adjusting section 11 into a DC (direct current) signal, and the DC signal is inputted to the integrator circuit 13. The integrator circuit 13 continuously integrates the inputted DC audio signal and inputs its average value to the level adjusting section 14. Then, the level adjusting section 14 inputs the input switching control signal to the lock up circuit 15 by comparing the audio signal integrated by the integrator circuit 13 with a predetermined reference value. At that time, if the audio signal from the integrator circuit 13 is larger than the reference sound input value, a 'low' level input switching control signal is outputted. Otherwise, a 'high' level input switching control signal is outputted.

The lock up circuit 15 outputs the 'high' or 'low' level input switching control signal inputted from the level adjusting section 14 to the section 16 in the outputted value. For example, if the input switching control signal of the level adjusting section 14 is 'high', the lock up circuit 15 maintains continuously the 'high' level state during the time power of the monitor is on. On the other hand, the input switching control signal of the level adjusting section 14 is 'low', the lock up circuit 15 maintains continuously the 'low' state. Accordingly, the switching section 16 switches one of the output signals of the input sensitivity adjusting section 11 to the pre-amplifier 17. Specifically, if the input switching control signal of the level adjusting section 14 is 'high', the switching section 16 switches the input terminal of the pre-amplifier to the low terminal of the input sensitivity adjusting section 11. If the input switching control signal of the level adjusting section 14 is 'low', however, the switching section 16 switches the input terminal of the pre-amplifier 17 to the high terminal of the input sensitivity adjusting section 11. Thus, the pre-amplifier 17 pre-amplifies the audio signal properly attenuated by the input sensitivity adjusting section 11 and inputs it to the power-amplifier 18. The power-amplifier 18 power-amplifies the sound output signal of the pre-amplifier 17, and inputs it to the loudspeaker 19. Thus, the loudspeaker 19 radiates outwardly the audio signal inputted from the power amplifier 18.

On the other hand, if the power of the monitor is off on operation thereof, the lock up circuit 15 connects the input terminal of the pre-amplifier 17 with 'high' level terminal of the input sensitivity adjusting section 11, i.e., the initial setting state.

According to the present invention, regardless of the kinds of sound cards of the personal computer connected to the input sensitivity adjusting section 11 of the present invention, the present circuit will repeat the above operation to automatically adjust the input sensitivity of the audio signal. Therefore, the audio signal radiated from the loudspeaker of the monitor can radiate clearly without distortion.

With the construction of the present invention as described above, the circuit for automatically adjusting the input sensitivity of a sound to a monitor can prevent the audio signal processing circuit of the monitor from being damaged, by setting a proper reference value of the input sensitivity of the sound of the monitor and by applying a proper sound input depending upon the size of the sound input of the personal computer, even when a sound circuit is applied with an overloaded signal from the output of the sound card or the loudspeaker of the personal computer.

While the present invention has been described and illustrated herein with reference to the preferred embodiment thereof, it will be understood by those skilled in the art that various changes in form and details may be made therein without departing from the spirit and scope of the invention.

What is claimed is:

1. An audio input adjusting circuit for a monitor having an audio amplifier for amplifying an audio signal, comprising:

an input level adjusting section having an audio input terminal for receiving an input signal, a first output terminal outputting a first signal, and a second output terminal outputting a second signal having a lower level than the first signal;

a converter coupled to the input level adjusting section and operable to convert the input signal into a DC signal;

an integrator circuit, coupled to the converter for integrating the DC signal converted by the converter;

a comparator coupled to the integrator circuit and operable to compare an output of the integrator circuit with a reference signal;

a lock up circuit coupled to the comparator and operable to maintain at its output the logic state of an output of the comparator circuit; and a switching circuit coupled to the lock up circuit and operable to switch the input of the audio amplifier to either the first output terminal or the second output terminal of the input level adjusting section according to an output of the lock up circuit.

2. The audio input adjusting circuit according to claim 1, wherein the input level adjusting section includes a voltage divider coupled between the input terminal and ground, each of the first and second output terminals being coupled to the voltage divider.

* * * * *